United States Patent
Lu et al.

(10) Patent No.: US 6,365,517 B1
(45) Date of Patent: Apr. 2, 2002

(54) PROCESS FOR DEPOSITING THIN FILMS CONTAINING TITANIUM AND NITROGEN

(75) Inventors: Jiong-Ping Lu; Ming-Jang Hwang, both of Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/010,373

(22) Filed: Jan. 21, 1998

Related U.S. Application Data

(60) Provisional application No. 60/035,877, filed on Jan. 21, 1997.

(51) Int. Cl.[7] .............................................. H01L 21/443
(52) U.S. Cl. ........................ 438/683; 438/680; 438/685
(58) Field of Search .............................. 438/680, 685, 438/676, 653, 688, 683

(56) References Cited

U.S. PATENT DOCUMENTS

| | | | |
|---|---|---|---|
| 5,296,404 A | * | 3/1994 | Akahori et al. .............. 438/668 |
| 5,616,518 A | * | 4/1997 | Foo et al. .................... 438/680 |
| 5,770,520 A | * | 6/1998 | Zhao et al. .................. 438/653 |
| 5,789,321 A | * | 8/1998 | Oshita ......................... 438/680 |
| 5,956,616 A | * | 9/1999 | Mizuno et al. .............. 438/680 |
| 6,090,709 A | * | 7/2000 | Kaloyeros et al. .......... 438/685 |

OTHER PUBLICATIONS

Sanders, et al., "Influence of temperature on the growth on TiN films by plasma–assisted chemical vapour deposition," Thin Solid Films, 161 (1988) L87–L90.

* cited by examiner

*Primary Examiner*—Caridad Everhart

(57) ABSTRACT

An embodiment of the instant invention is a method of depositing a TiN-based film over a semiconductor wafer, the method comprising the steps of: substantially simultaneously subjecting the semiconductor wafer to $TiCl_4$, $H_2$, and $N_2$; and subjecting the semiconductor wafer to a plasma, such that the combination of the $TiCl_4$, $H_2$, and $N_2$ and the plasma cause the deposition of a TiN based film to form over the semiconductor wafer. Another embodiment of the instant invention involves additionally subjecting the semiconductor wafer to $SiH_4$ so as to form a $TiSi_xN_y$ film over the semiconductor wafer. Another embodiment of the instant invention involves additionally subjecting the semiconductor wafer to $B_2H_6$ so as to form a $TiN_xB_y$ layer over the semiconductor wafer.

3 Claims, 1 Drawing Sheet

PROCESS FOR DEPOSITING THIN FILMS CONTAINING TITANIUM AND NITROGEN

This is a Non Provisional application filed under 35 USC 119(e) and claims priority of prior provisional, Ser. No. 60/035,877 of inventor Lu, et al, filed Jan. 21, 1997.

RELATED PATENTS/PATENT APPLICATIONS

The following co-assigned patents/patent applications are related to the present invention and are hereby incorporated herein by reference:

| Patent or Serial No. | Filing Date | Issue Date | Attorney Docket |
|---|---|---|---|
| 60/028 798 | 10-31-96 | not issued | TI-22932 |
| 60/010 405 | 01-22-96 | not issued | TI-22324 |

FIELD OF THE INVENTION

This invention relates generally to semiconductor device fabrication and more specifically to the formation of a TiN-based film.

BACKGROUND OF THE INVENTION

Films containing titanium nitride are commonly used as a diffusion barrier in contacts, vias, trenches, and interconnect stacks. They are also used as a "glue" layer for chemical vapor deposited (CVD) tungsten, as a nucleation layer for CVD tungsten and CVD aluminum, as a liner for contacts, vias and trenches, as a capacitor electrode, and as an anti-reflective coating. A good barrier layer should have: good step coverage to achieve void-free plug formation and adequate barrier thickness at the bottom of the contact/via/trench; good diffusion barrier properties to prevent diffusion of metals and other materials into underlying layers; inertness and low reactivity with adjacent materials during thermal cycles; and acceptable electrical properties such as low resistivity, low contact/via resistance and low junction leakage.

Currently, TiN-based barrier films are formed by physical vapor deposition (PVD) using reactive sputtering. This type of sputtering method is line-of-sight technique and produces films with poor step coverage. As minimum feature sizes continues to shrink and the aspect ratio of contacts/vias/trenches continues to increase, processes that produce conformal films are in great demand.

CVD processes offer the potential advantage of good step coverage and have attracted increasing attention in the past few years for fabricating TiN based films. Two types of CVD processes are being developed currently: one based on metal-organic (MO) precursors, such as tetras(dimethylamino)-titanium (TDMAT) and tetras(diethylamino)-titanium (TDEAT); and the other based on inorganic precursors, such as $TiCl_4/NH3$. The MO based processes produce films with high carbon content and low stability. The $TiCl_4/NH_3$ process requires high deposition temperature and have severe problems associated with $NH_4Cl$ salt formation.

Prior CVD process for $TiSi_xN_y$ uses $Ti[N(C_2H_5)_2]_4/NH_3/SiH4$ chemistry. The drawbacks of this approach includes: gas phase reaction between the Ti precursor and $NH_3$, lower density, less stable films than those using $TiCl_4$ as a precursor, and lower vapor pressure of metalorganic precursor as compared to $TiCl_4$.

A process for depositing a TiN film on tools was developed using CVD. See F. H. M. Sanders and G. Verspui, *Influence of Temperature on the Growth of TiN Films by Plasma-Assisted Chemical Vapor Deposition*, 161 THIN SOLD FILMS L87–L90 (1988). This method uses a combination of $H_2$, $N_2$, and $TiCl_4$ in conjunction with a plasma to form the TiN layer on the tool to prevent corrosion of the tool.

SUMMARY OF THE INVENTION

The instant invention relates to the deposition of titanium nitride based films for barrier layers, gate dielectrics, and for capacitor electrodes. Advantages of the instant inventions include: better step coverage than standard PVD formed TiN based films; use of $TiCl_4$ in the deposition of the film—$TiCl_4$ has higher vapor pressure and is less expensive than MO precursors; higher purity, density, and stability of the films formed by the instant invention than MOCVD formed films; greatly reduced formation of $NH_4Cl$ salts; lower deposition temperature than standard processes; and flexibility in control of Si/N and B/N atomic ratios.

An embodiment of the instant invention is a method of depositing a TiN-based film over a semiconductor wafer, the method comprising the steps of: substantially simultaneously subjecting the semiconductor wafer to $TiCl_4$, $H_2$, and $N_2$; and subjecting the semiconductor wafer to a plasma, such that the combination of the $TiCl_4$, $H_2$, and $N_2$ and the plasma cause the deposition of a TiN based film to form over the semiconductor wafer. Another embodiment of the instant invention involves additionally subjecting the semiconductor wafer to $SiH_4$ so as to form a $TiSi_xN_y$ film over the semiconductor wafer. Another embodiment of the instant invention involves additionally subjecting the semiconductor wafer to $B_2H_6$ so as to form a $TiN_xB_y$ layer over the semiconductor wafer.

DETAILED DESCRIPTION OF THE DRAWINGS

Figure 1:
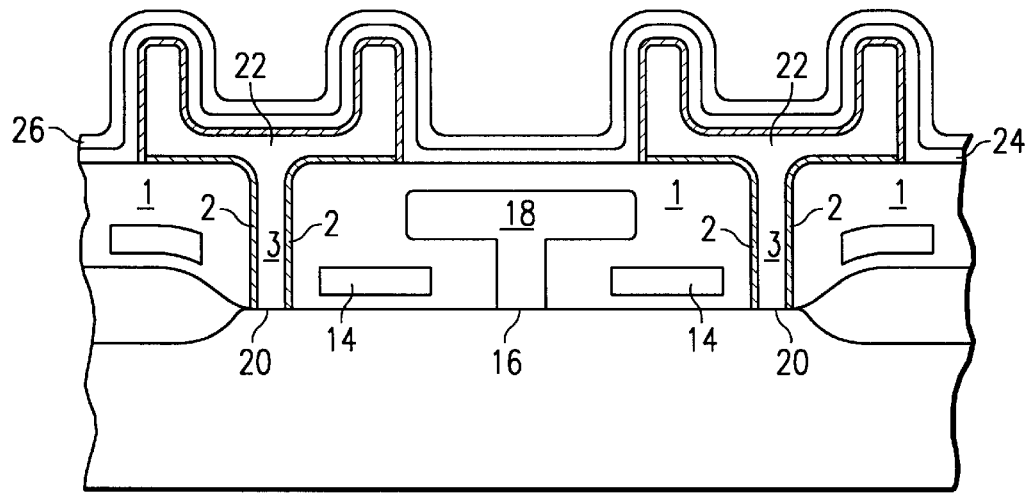
FIG. 1 is a cross-sectional view of a contact/via/trench which is fabricated using an embodiment of the instant invention.

The embodiments of the instant invention revolve around the novel formation of TiN based films. As will be illustrated in FIGS. 1, 2, and 3, the novel TiN based films of the instant invention can be used to form the liner layer for contacts/vias/trenches, the diffusion barrier/glue layer underlying a conductive gate structure, or the electrode(s) for a storage capacitor.

One embodiment of the instant invention is the novel chemical vapor deposition of a TiN layer. This embodiment of the instant invention utilizes $TiCl_4$, $N_2$, and $H_2$ in conjunction with a plasma to form a TiN layer. The reaction is,

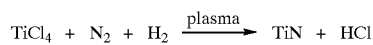

More specifically, a wafer is inserted into a plasma chamber and $TiCl_4$, $N_2$, and $H_2$ are pumped into the chamber along with a plasma (preferably a nitrogen plasma) being formed in the chamber. The combination of these gases and the plasma will result in the chemical vapor deposition of a TiN film on the wafer. As is illustrated in the above, there is no detrimental formation of any salts (which degrades the prior art solutions). Preferably, the above reaction takes place in a plasma reactor (or a high density plasma reactor) with the following conditions: $TiCl_4$ flow of approximately 20–100 sccm (using $N_2$ as a carrier gas); $N_2$ flow of approximately 200–500 sccm; $H_2$ flow of approximately 300–550 sccm; susceptor temperature of around 350 to 500° C.; total pressure of around 0.5 to 1.5 torr; electrode spacing of around 500 to 750 mils; RF power density of around 1 to 2.5 W/cm$^2$; deposition time of around 10 to 60 seconds (preferably around 25 seconds). Using this embodiment of the instant invention a layer of approximately 10 to 30 nanometers will be formed.

Another embodiment of the instant invention involves the novel chemical vapor deposition of a TiN layer. This embodiment of the instant invention utilizes a CVD process and $TiCl_4$, $N_2$, $SiH_4$ and $H_2$ in conjunction with a plasma to form a $TiSi_xN_y$ layer. The reaction is,

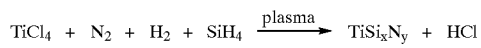

$$TiCl_4 + N_2 + H_2 + SiH_4 \xrightarrow{plasma} TiSi_xN_y + HCl$$

More specifically, a wafer is inserted into a plasma chamber and $TiCl_4$, $N_2$, $SiH_4$ and $H_2$ are pumped into the chamber along with a plasma (preferably a nitrogen plasma) being formed in the chamber. The combination of these gases and the plasma will result in the chemical vapor deposition of a $TiSi_xN_y$ film on the wafer. As is illustrated in the above, there is no detrimental formation of any salts (which degrades the prior art solutions). Preferably, the above reaction takes place in a plasma reactor (or a high density plasma reactor) using an N2 plasma. The following process conditions are preferably used: $TiCl_4$ flow of approximately 20–100 sccm (using $N_2$ as a carrier gas); $SiH_4$ flow of around 2 to 10 sccm; $N_2$ flow of approximately 200–500 sccm; $H_2$ flow of approximately 300–550 sccm; susceptor temperature of around 350 to 500° C.; total pressure of around 0.5 to 1.5 torr; electrode spacing of around 500 to 750 mils; RF power density of around 1 to 2.5 W/cm$^2$; deposition time of around 10 to 60 seconds (preferably around ten to 30 seconds). Using this embodiment of the instant invention a layer of approximately 10 to 30 nm will be formed.

Another embodiment of the instant invention involves the novel chemical vapor deposition of a TiN layer. This embodiment of the instant invention utilizes a CVD process and $TiCl_4$, $N_2$, $B_2H_6$ and $H_2$ in conjunction with a plasma to form a $TiSi_xN_y$ layer. The reaction is,

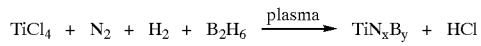

$$TiCl_4 + N_2 + H_2 + B_2H_6 \xrightarrow{plasma} TiN_xB_y + HCl$$

More specifically, a wafer is inserted into a plasma chamber and $TiCl_4$, $N_2$, $B_2H_6$ and $H_2$ are pumped into the chamber along with a plasma (preferably a nitrogen plasma) being formed in the chamber. The combination of these gases and the plasma will result in the chemical vapor deposition of a $TiN_xB_y$ film on the wafer. As is illustrated in the above, there is no detrimental formation of any salts (which degrades the prior art solutions). Preferably, the above reaction takes place in a plasma reactor (or a high density plasma reactor) using an N2 plasma. The following process conditions are preferably used: $TiCl_4$ flow of approximately 20–100 sccm (using N2 as a carrier gas); 10% $B_2H_6$/90%$N_2$ flow of approximately 20–100 sccm; $N_2$ flow of approximately 150–450 sccm; $H_2$ flow of approximately 300–550 sccm; susceptor temperature of around 350 to 500° C.; total pressure of around 0.5 to 1.5 torr; electrode spacing of around 500 to 750 mils; RF power density of around 1 to 2.5 W/cm$^2$; deposition time of around 10 to 60 seconds (preferably around 25 seconds). Using this embodiment of the instant invention a layer of approximately 10–30 nm will be formed.

Preferably, these embodiments of the instant invention are carried out in plasma CVD reactors, preferably using RF plasma powered electrodes. After the wafer is introduced to reactor with substrate holed heated to the designated deposition temperature (300–550C), required reactants are flowed into the reactor and the flows are stabilized in approximately five to ten seconds. The total pressure inside the reactor after the flows are stabilized is, preferably, in the range of 0.5–5 torr. The RF power, preferably with a power density of around 0.5–2.5 W/cm$^2$ is then turned on. The duration of this step is determined by the thickness requirement of the films. After $TiCl_4$ and $SiH_4$ or $B_2H_5$ flows are turned off, $H_2/N_2$ and RF power flows are, preferably, kept on for several more seconds to ensure residual Ti, Si or B precursors are reacted.

The aforedescribed embodiments of the instant invention can be implemented in many different ways. While FIG. 1 illustrates a contact which is directly connected to a storage capacitor, the embodiments of the instant invention can be utilized in the formation of any contact/via/trench. FIG. 1 is a cross-sectional view of a semiconductor device. More specifically, FIG. 1 illustrates contact/via/trench 20 which is lined with the TiN-based liner of the instant invention. Liner 2 may be comprised of the TiN formed in the first embodiment of the instant invention, $TiSi_xN_y$ formed in the second embodiment of the instant invention, or $TiN_xB_y$ formed in the third embodiment of the instant invention. Each of these lines are useful as diffusion barriers to prevent diffusion/reaction of the via/contact/trench metals 3 (preferably tungsten, aluminum, copper or any combination thereof) with silicon, silicides, or dielectric materials (such as interlevel dielectric 1 which is preferably comprised of PSG, BPSG, SOG, HSQ, aerogels, xerogels, or any other oxide or nitride based materials). In addition, the liners formed by the instant invention promote adhesion of tungsten metalization and aluminum reflow. Furthermore, the liners formed using the instant invention will have lower resistivity than standard MOCVD processes. Therefore, contact/vias/trenches which utilize the instant invention will have low contact/via resistance. This use of the instant invention may be utilized along with a damascene process or any other process with forms a contact/via/trench. In addition, in can be used with aluminum, copper, tungsten, or any other type of metalization. It can even be utilized in a ForceFill type of process.

Figure 2:
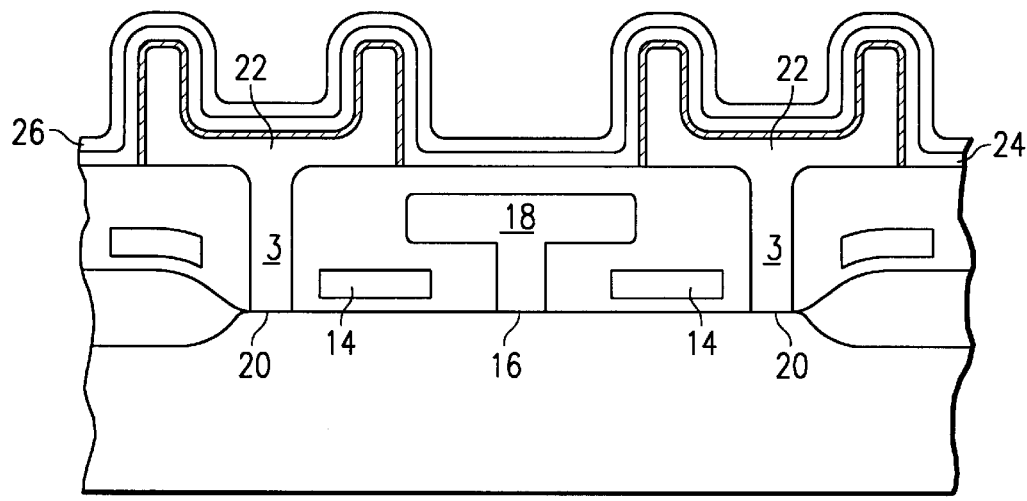
FIG. 2 is a cross sectional view of a DRAM capacitor structure which is fabricated using an embodiment of the instant invention.

FIG. 2 is a cross-sectional view of a storage capacitor for a memory device (preferably a DRAM) which utilizes the layers formed by the embodiments of the instant invention. Top electrode 26 and/or storage node 22 can be comprise of TiN, $TiSi_xN_y$, or $TiN_xB_y$ which are formed using the embodiments of the instant invention. Top and bottom electrodes formed using the embodiments of the instant invention will have higher mass density than MOCVD films and have lower leakage current. Preferably, dielectric layer 24 is formed over the storage node 22. Dielectric layer 24 can comprise an oxide, a nitride or a combination of the two (e.g., an oxide-nitride-oxide or oxide-nitride stack or oxynitride). In addition, dielectric layer 24 may be comprised of tantalum pentoxide ($Ta_2O_5$), barium strontium titanate or simply BST ($Ba_{1-x}Sr_xTiO_3$), strontium titanate ($SrTiO_3$), strontium bismuth tantalate or simply SBT and lead zirconium titanate or simply PZT ($Pb_{1-x}Zr_xTiO_3$). It is preferable that a high dielectric constant material (i.e., $k \geq \sim 20$) is used. For example, a 15 nm thick $Ta_2O_5$ film which is deposited at about 400° C. can be used.

Figure 3:
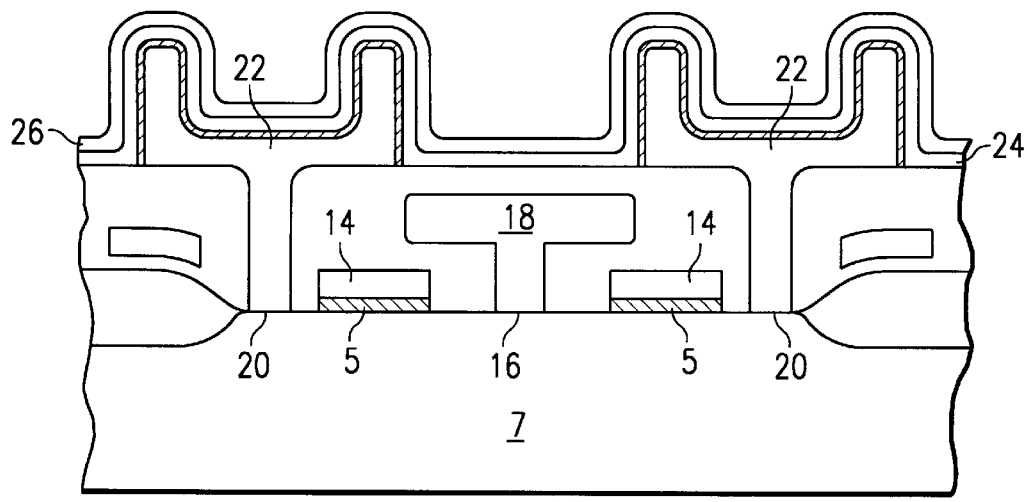
FIG. 3 is a cross sectional view of a semiconductor device which is fabricated using an embodiment of the instant invention.

FIG. 3 is a cross-sectional view of transistors which utilize the instant invention so as to form a portion of gate structure 14. Gate structure 14 can be formed using polysilicon (preferably doped), silicided polysilicon, or a metal. However, use of a stack (preferably a poly-metal stack— more preferably a poly-tungsten stack) will lower the sheet resistance of the gate structure and therefore the device would have a reduced RC constant (hence, higher performance). However, a diffusion barrier is needed to prevent a reaction between the tungsten and the poly. In addition, an adhesion promoter is need in a tungsten-based gate structure so as to better adhere the tungsten layer to the gate insulator 5. More specifically, the TiN, $TiSi_xN_y$, or $TiN_xB_y$ layers, which are formed using the embodiments of the instant invention, would be used between the polysilicon portion of gate structure 14 and the overlying tungsten portion of gate 14 or it would be used between gate insulator 5 (preferably an oxide, a nitride, or a combination thereof) and gate structure 14 which is preferably comprised of tungsten.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What we claim is:

1. A method of depositing a TiN-based film over a semiconductor wafer, said method comprising the steps of:

substantially simultaneously subjecting said semiconductor wafer to $TiCl_4$, $H_2$, and $N_2$; and subjecting said semiconductor wafer to a nitrogen plasma, such that the combination of said $TiCl_4$, $H_2$, and $N_2$ and said nitrogen plasma cause the deposition of a TiN based film to form over said semiconductor wafer;

wherein said semiconductor wafer is also subjected to $SiH_4$ so that the TiN based film is comprised of a compound of Ti, Si, and N.

2. A method of depositing a TiN-based film over a semiconductor wafer, said method comprising the steps of:

substantially simultaneously subjecting said semiconductor wafer to TiCl4, $H_2$, and $N_2$; and subjecting said semiconductor wafer to a plasma, such that the combination of said $TiCL_4$, $H_2$, and $N_2$ and said plasma cause the deposition of a TiN based film to form over said semiconductor wafer;

wherein said semiconductor wafer is also subjected to $B_2H_6$ so that the TiN based film is comprised of a compound of Ti, N, and B.

3. The method of claim 2, wherein said plasma is a nitrogen plasma.

* * * * *